United States Patent
Jacobsen

(10) Patent No.: US 7,395,495 B2
(45) Date of Patent: Jul. 1, 2008

(54) METHOD AND APPARATUS FOR DECODING FORWARD ERROR CORRECTION CODES

(75) Inventor: Eric A. Jacobsen, Scottsdale, AZ (US)

(73) Assignee: Intel Corporation, Santa Clara, CA (US)

(*) Notice: Subject to any disclaimer, the term of this patent is extended or adjusted under 35 U.S.C. 154(b) by 675 days.

(21) Appl. No.: 10/798,643

(22) Filed: Mar. 10, 2004

(65) Prior Publication Data
US 2005/0154957 A1 Jul. 14, 2005

Related U.S. Application Data

(60) Provisional application No. 60/536,071, filed on Jan. 12, 2004.

(51) Int. Cl.
*G06F 11/00* (2006.01)
*H03M 13/00* (2006.01)

(52) U.S. Cl. ........................ 714/804; 714/758
(58) Field of Classification Search ................ 714/804, 714/758
See application file for complete search history.

(56) References Cited

U.S. PATENT DOCUMENTS

| | | | |
|---|---|---|---|
| 6,189,123 B1 * | 2/2001 | Anders Nystrom et al. | 714/751 |
| 6,353,911 B1 * | 3/2002 | Brink | 714/780 |
| 6,518,892 B2 * | 2/2003 | Shen et al. | 341/50 |
| 6,751,770 B2 * | 6/2004 | Morelos-Zaragoza | 714/781 |
| 6,757,122 B1 * | 6/2004 | Kuznetsov et al. | 360/53 |
| 6,888,897 B1 * | 5/2005 | Nazari et al. | 375/262 |
| 7,103,825 B2 * | 9/2006 | Yedidia et al. | 714/760 |
| 7,149,953 B2 * | 12/2006 | Cameron et al. | 714/794 |
| 2004/0148561 A1 * | 7/2004 | Shen et al. | 714/803 |

* cited by examiner

*Primary Examiner*—Mujtaba K. Chaudry
(74) *Attorney, Agent, or Firm*—Pearl Cohen Zedek Latzer, LLP

(57) ABSTRACT

A method for decoding information received at a network device may include a first decoding process which applies a first algorithm iteratively until a stopping criterion is reached and a second decoding process which may flip a logic state of one or more bits. In one implementation using low density parity check (LDPC) codewords, bits may be flipped after evaluating check nodes having the lowest metrics and/or assessing the parity relationships of bit nodes and/or edges associated with those check nodes. Devices and systems for decoding are also disclosed as well as various other embodiments.

20 Claims, 5 Drawing Sheets

Parity check Matrix, H

US 7,395,495 B2

METHOD AND APPARATUS FOR DECODING FORWARD ERROR CORRECTION CODES

CROSS-REFERENCE TO RELATED APPLICATIONS

This application claims benefit of priority under 35 U.S.C. § 119(e) to U.S. Application 60/536,071, which was filed on Jan. 12, 2004 and incorporated herein by reference.

BACKGROUND OF THE INVENTION

Most communications networks are designed to convey multiple communications simultaneously over each individual communication path, for example, a radio frequency (RF) channel or physical connection, using some type of modulation. In recent years, an increasing demand has arisen for efficient and reliable digital data transfers which assure correct data transmissions at as great a data rate as possible. Forward error correction (FEC) codes have been used in some communications systems for this purpose.

Codes are essentially digital data sequences derived from message sequences and used to convey message information. In forward error correction (FEC), information may be encoded to provide the abilities of detection and/or correction of errors occurring in a transmission, for example resulting from a noisy channel. The receiver in a communication system can recover all the information in the codewords by itself and thus coding lends advantages to high speed communication systems and/or those requiring synchronous communications.

For block coding, as opposed to convolutional coding, an encoder divides the information to be sent into message blocks of length k. In binary block encoding, each message block is represented by a binary k-tuple $u=(u_1, u_2, \ldots, u_k)$ called a "message," thus there are $2^k$ different possible messages altogether. The encoder transforms each message m independently into an n-tuple $c=(c_1, c_2, \ldots, c_n)$ called a "codeword." Therefore, there are $2^k$ different possible codewords at the encoder output. The set of $2^k$ codewords of length n is called a (n, k) "block code."

Low Density Parity Check (LDPC) codes are a type of FEC block codes that that can be iteratively decoded. LDPC codewords are constructed using a number of simple parity-check relationships shared between the bits in a codeword. Various different decoding algorithms can be applied to decode LDPC codes but most obtain the greatest gain when applied iteratively.

Generally, the more decoding iterations applied to decode each LDPC codeword, the lower the codeword error rate given equal code rates. However, the number of decoding iterations that may be performed on each codeword may be limited by available time in high speed communication networks with restrictive decoding latency requirements. Further, the complexity and/or processing capabilities of a decoder may increase with the number of decoding iterations to be performed. Accordingly, it would be desirable to have a technique and/or system for decoding LDPC codes with a limited number of decoding iterations while maintaining an acceptable codeword error rate or bit error rate (BER).

BRIEF DESCRIPTION OF THE DRAWING

Aspects, features and advantages of the present invention will become apparent from the following description of the invention in reference to the appended drawing in which like numerals denote like elements and in which.

DETAILED DESCRIPTION OF THE INVENTION

While the following detailed description may describe example embodiments of the present invention in relation to wireless networks, the embodiments of present invention are not limited thereto and, for example, can be implemented using wired systems such as Ethernet or Token ring networks and/or optical networks where suitably applicable.

The following inventive embodiments may be used in a variety of applications including receivers and/or transceivers of a radio system, although the present invention is not limited in this respect. Radio systems specifically included within the scope of the present invention include, but are not limited to: wireless local area network (WLAN) systems and wireless wide area network (WWAN) systems and related network interface devices and peripherals such as network interface cards (NICs), base stations, access points (APs), gateways, bridges, hubs and cellular radiotelephones. Further, the network systems within the scope of the invention may include cellular radiotelephone systems, satellite systems, personal communication systems (PCS), two-way radio systems, one-way pages, two-way pagers, personal computers (PC), personal digital assistants (PDA), personal computing accessories (PCA) and all future arising systems which may be related in nature and to which the principles of the invention could be suitably applied.

While the following detailed description references example implementations in relation to Low Density Parity Check (LDPC) codes, the inventive aspects are not necessarily limited thereto and can be applied to other coding/decoding schemes where suitably appropriate.

LDPC codes are a form of error correction codes similar to Turbo codes, but much more computationally intensive with the advantage that they can achieve near Shannon-limit communication channel capacity. An LDPC code is a linear message encoding technique defined by a sparse parity check matrix. The message to be sent is encoded using a generator matrix or the sparse parity check matrix and when it reaches its destination, it is decoded using the sparse parity check matrix.

Figures 1, 2:
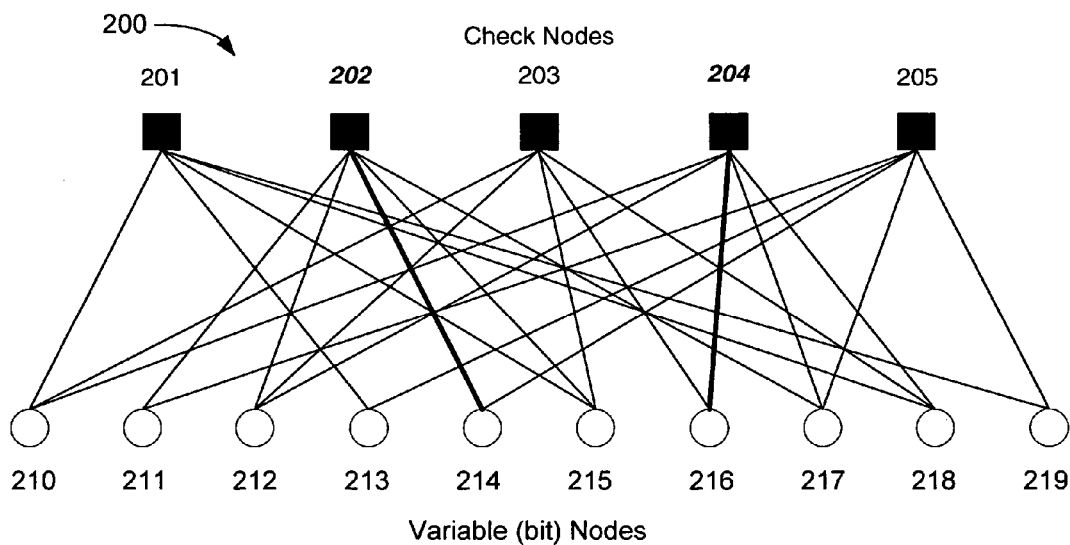
FIG. 1 is a matrix showing an example parity check matrix for decoding information according to various embodiments of the present invention.
FIG. 2 is a bipartite graph showing an example parity relationship for the parity check matrix shown in FIG. 1.

Turning to FIGS. 1 and 2 respectively, a sample parity check matrix 100 and associated bipartite graph 200 showing the parity relationships of a 10-bit codeword are shown. An LDPC decoding algorithm is of a series of computations derived from a message-passing iterative bipartite graph such as graph 200. In this example, variable nodes 210-219 (also called "bit nodes") represent the bits in a codeword and check nodes 201-205 represent the parity relationships between those bits. The lines connecting check nodes 201-205 to variable nodes 210-219 are called "edges." The number of check nodes 201-205 and bit nodes 210-219, as well as how they communicate, is defined by parity check matrix 100 (FIG. 1). The basic principle is to measure the probability of an encoded bit having a logic state of 0 or 1 based on the probable values of the other bits in the same word. A sequence of decoding iterations may be performed to either converge the probability value towards a bit value of zero or one.

The bit and check nodes essentially perform a series of computations to reach a convergence on the likelihood about the logic state (for example using a set of bilinear transforms to converge a value toward zero or infinity). This operation is iterative and eventually after a series of iterations the likelihood ratio converges in one direction or the other.

The confidence that the logic state is a zero or a one is referred herein as "soft metrics" or "metrics." In one example implementation, the lower the metrics, the lower the confidence about the bit logic state. In an ideal system, decoding iterations would be performed until there is near absolute certainty about each bit logic state and discard bits which do not result in a convergence. However, as previously mentioned, the decoding latency requirements of the network and/or the processing capabilities of the decoder may be a limiting factor in the number of iterations that can or will be performed. The present inventor has discovered that in certain systems implementing iterative decoding, the codeword error rate is often dominated by codewords with very small numbers of bit errors. Accordingly, it is proposed that if the decoding system is configured to detect and correct one or more bit errors after a last decoding iteration, the codeword error rate may be substantially reduced. For example, the ability to correct just two bit errors after a last decoding iteration may be equivalent to executing an additional decoding iteration.

Figure 3:
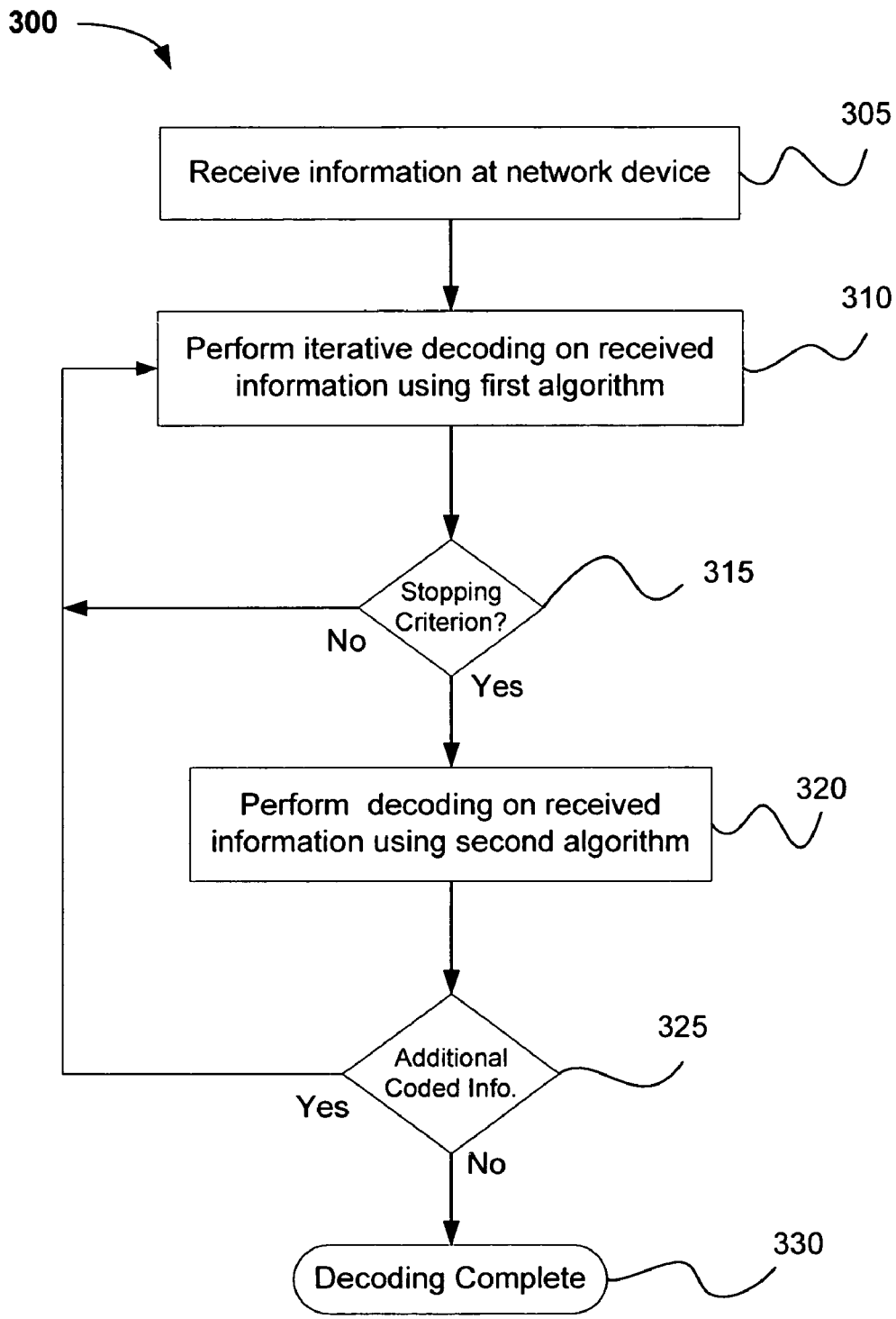
FIG. 3 is a flow chart illustrating a method for decoding information in a communication network according to one embodiment of the present invention.

Turning to FIG. 3, a method 300 for decoding information generally includes decoding 310 information using an iterative decoding algorithm until a stopping criterion is reached 315 and decoding 320 the information using a second decoding algorithm to further reduce the bit error rate or codeword error rate.

In one example implementation, coded information is received 305 at a network device such as a wireless local area network (WLAN) access point (AP) or a network interface card (NIC), although the embodiments of the invention are not limited in this respect. At 310, an iterative decoding process may be performed on the coded information until a stopping criterion is reached 315. The iterative decoding process may include applying any type of decoding algorithm to the received coded information a number of times (i.e., iterations) to converge a probability that a logic state for individual bits is one or zero. For example, various types of LDPC decoding algorithms may be used for check-to-bit and/or bit-to-check message passing; alternatively, if applicable, Turbo code or other non-LDPC decoding algorithms could be used.

Stopping criteria 315 may be for example, completion of a desired number of iterations, a length of elapsed time, an achieved bit error rate or codeword error rate or any other criterion suitable for ceasing the iterative decoding 310.

After the last decoding iteration of 310, a second decoding process is performed 320 on the information to further reduce the potential error rate. This second process may involve applying a second decoding algorithm to the information. In one embodiment, the second decoding algorithm is preferably less processing intensive than additional iterations performed with the first decoding algorithm. The second decoding algorithm may include calculating or reviewing the present likelihood (i.e., after a number of decoding iterations) of each bit being a one or a zero and flipping one or more bits having the lowest likelihood. As used herein, flipping a bit means changing its binary value to the opposite value, for example changing a one to a zero or vice versa. If there is additional information to be decoded 325, for example a next codeword, the first and second decoding processes 310, 320 may be repeated until all received information has been decoded 330.

Figure 4:
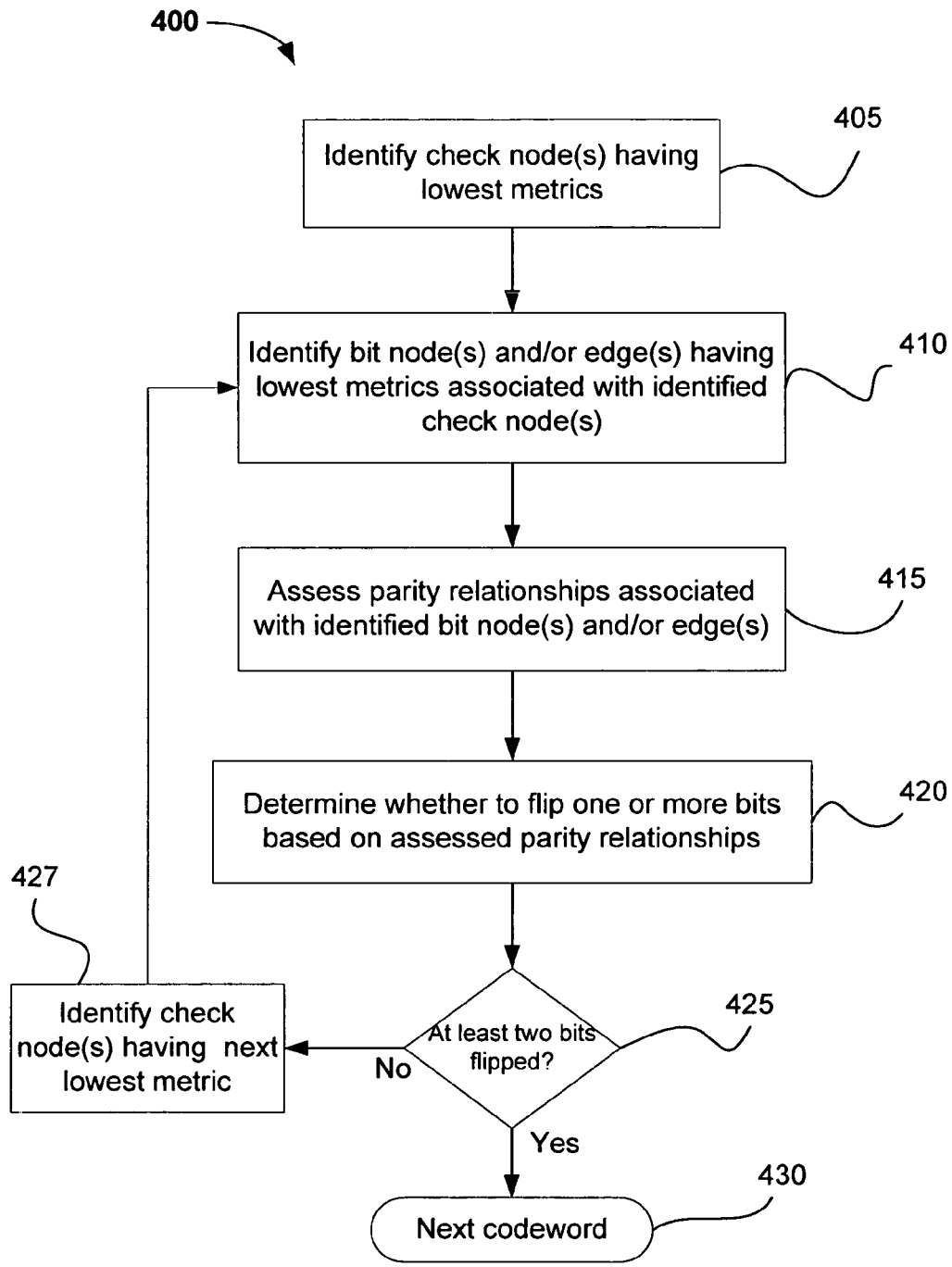
FIG. 4 is a flow chart illustrating an example second decoding algorithm which may be applied after a first iterative decoding process is completed.

Turning to FIG. 4, a non-limiting example of a second decoding process 400 or algorithm (e.g., 320; FIG. 3) will be described. As broadly used herein, an "algorithm" is a procedure for accomplishing an end result. In this example, it is assumed that a last iteration has already been completed in an iterative LDPC decoding process (e.g., in FIG. 3, the first algorithm 310 has been applied). Process 400 may include locating or identifying 400 one or more check nodes having the lowest metrics. In the example bipartite graph 200 of FIG. 2, two check nodes 202 and 204 are identified to have the lowest metrics (shown in italics).

The bit nodes or edges having the lowest metrics and which are associated with the identified check nodes may be identified 410 (in FIG. 2, two identified edges are shown in bold). The codeword bits corresponding to the identified bit nodes or edges (e.g., corresponding to nodes 214, 216; FIG. 2) are then candidates for flipping. The bits may be automatically flipped or a decision whether or not to flip the bits may be made based on a number of potential factors. In one example embodiment, the parity relationships associated with the identified bit nodes or edges may be assessed 415 to provide a further indication of whether or not to flip the candidate bits. (Note: in FIG. 2, each of the variable nodes 214 and 216 is a member of two different parity relationships, since each has two edges connected to it).

Process 400 may further include a repetitive action where if a certain number of bits have not been flipped 425 (for example, at least two bits), a next check node having the next lowest metric compared to the previously identified check node(s) may be identified 427 and the process repeated until a desired number of bits has been flipped 425. When the desired number of bits has been flipped or the codeword has been exhaustively searched, the second decoding process of this example embodiment is completed 430 and the decoder moves on to the next codeword.

While process 400 details very specific actions for an example LDPC embodiment, it should be recognized that any process or algorithm which is suitable to correct one or more bit errors after an initial number of decoding iterations have been completed could also be used. Since iterative decoding typically has disadvantages in hardware complexity and decoding latency, the foregoing methods can provide a simplified technique which can reduce a number of decoding iterations and therefore reduce decoding latency and/or complexity of decoding hardware. Alternatively, the foregoing methods may increase the performance of coded transmissions as compared with conventional systems having the same latency requirements and hardware complexity.

Figure 5:
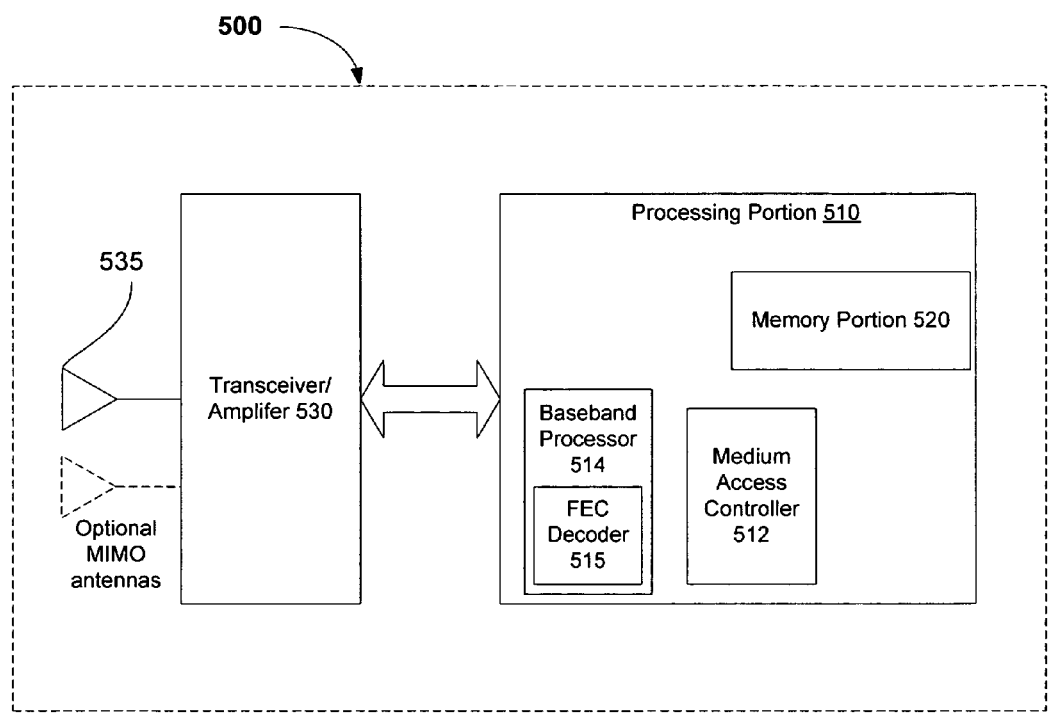
FIG. 5 is block diagram of an example communication device according to various aspects of the present invention.

Turning to FIG. 5, an example communication device 500 using FEC may generally include a code processing portion 510, and a memory portion 520 accessible by processing portion 510. Device 500 may also include a transceiver/amplifier portion 530 and/or one or more antennas 535. In certain example embodiments, coded information is transmitted/received wirelessly using OFDM modulation and demodulation techniques compatible with one or more Institute for Electrical and Electronic Engineers (IEEE) 802.11 standards for wireless local area networks (WLANs), although the inventive embodiments are not limited in this respect. (Note:

two antennas are shown in FIG. 5 for optional Multiple Input Multiple Output (MIMO) implementations).

Memory portion 520 may be one or more fixed, removable, internal or external memories and capable of storing machine readable code and/or other data which may be used by processing portion 510, for example to perform one or more of the FEC decoding processes described herein. Processing portion 510 and memory portion 520 may be any single component or combination of components for performing these functions.

Processing portion 510 may be configured to perform digital communication functions such as a medium access control 512 and/or baseband processing 514. In one example implementation, an FEC decoder 515 configured to perform the previously described first and second decoding algorithms (e.g., 310, 320; FIG. 3) is integrated, along with an optional digital demodulator (not separately shown), as part of a digital baseband processor 514. The inventive embodiments are however not limited in this respect. Additional elements, such as one or more analog to digital converters (ADC), digital to analog converters (DAC), an FEC encoder, a memory controller, a digital modulator or other associated elements, may also be included as part of device 500.

In certain embodiments, processing portion 510 and/or memory portion 520 may be implemented using one or more programmable devices such as a microprocessor, Digital Signal Processor (DSP), microcontroller or field programmable gate array. Additionally and/or alternatively, various elements of processing portion 510 may be implemented using discrete circuit components or as one or more application specific integrated circuits (ASICs). Other implementations may also be possible and the principles of the inventive embodiments are not limited to any specific hardware, software or firmware implementation.

Figure 6:
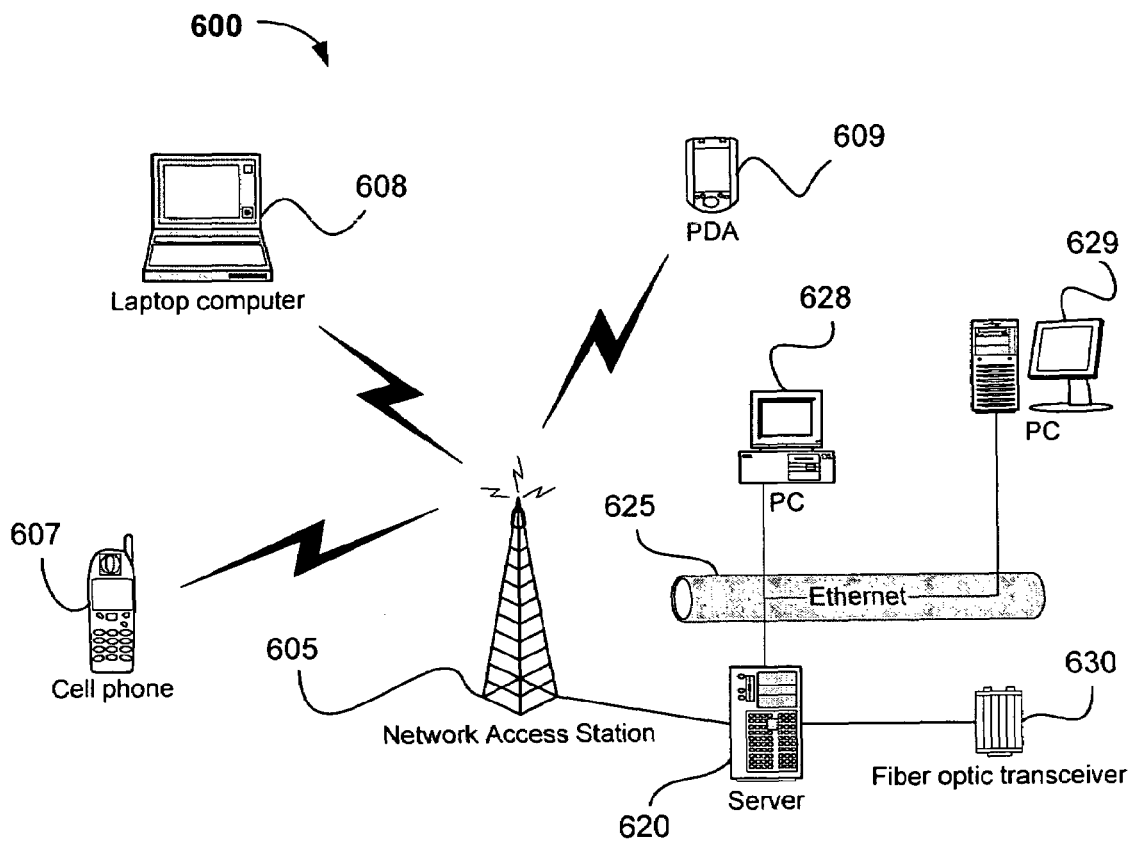
FIG. 6 is a block diagram of an example communication network including a decoding apparatus similar to that in FIG. 5.

Referring to FIG. 6, an example communication network 600 using forward error correction (FEC), and for which the inventive embodiments may be adapted, may include one or more wireless network access stations 605 and one or more wireless user stations 607-609. Wireless network access station 605 may be any device or combination of devices which facilitate network access to wireless user stations 607-609 via electromagnetic waves including for example, a wireless local area-network (WLAN) access point (AP), a wireless wide area network (WWAN) AP, a cellular telephone base station and the like. User stations 607-609 may be any device or component of such device configured to communicate with access station 605, including for example, a cellular telephone 607, a laptop computer 608, a personal digital assistant 609 or other communication or computing devices and/or their RF interfaces.

Network access station 605 may include and/or be communicatively coupled to a network processor 620 such as a network server, telephone circuit switch, or any other packet or frame-based network switch and/or information control device. Network 600 may additionally or alternatively include physically connected components such as those used in a wired network (e.g., Ethernet 625 and related user stations 628, 629) or a fiber optic network (e.g., fiber optic transceiver 630). Accordingly, any device in network 600 using FEC may suitably include decoding components arranged to perform the FEC decoding methods described herein.

Unless contrary to physical possibility, the inventor envision the methods described herein: (i) may be performed in any sequence and/or in any combination; and (ii) the components of respective embodiments combined in any manner.

Although there have been described preferred embodiments of this novel invention, many variations and modifications are possible without departing from the scope of the invention and the embodiments described herein are not limited by the specific disclosure above, but rather should be limited only by the scope of the appended claims and their legal equivalents.

The invention claimed is:

1. A decoding method comprising:
   decoding information received at a network device by applying a first algorithm iteratively until a stopping criterion is reached; and
   further decoding the information using a second algorithm different than the first algorithm, wherein the information comprises a low density parity check (LDPC) codeword, and wherein further decoding using a second algorithm comprises:
   identifying one or more check nodes having lowest metrics after the stopping criterion is reached,
   identifying at least one of a bit node or edge having lowest metrics and associated with each identified check node, and
   assessing parity relationships for the identified at least one bit node or edge.

2. The decoding method of claim 1 wherein the network device includes a radio frequency (RF) transceiver.

3. The decoding method of claim 2 wherein the RF transceiver comprises a wireless local area network (WLAN) transceiver.

4. The decoding method of claim 1 wherein the network device comprises an Ethernet device.

5. The decoding method of claim 1 wherein the stopping criterion comprises a number of decoding iterations.

6. The decoding method of claim 1 wherein the stopping criterion comprises an elapsed time.

7. The decoding method of claim 1 further comprising:
   flipping one or more bits associated with an identified check node.

8. A device comprising: a processor configured to decode received information using a first iterative decoding algorithm to converge a probability regarding bit logic states and after a last iteration, using a second decoding algorithm to determine whether to flip a logic state of one or more bits, wherein said second decoding algorithm comprises:
   identifying one or more cheek nodes having lowest metrics after said last iteration,
   identifying at least one of a bit node or edge having lowest metrics and associated with each identified check node, and
   assessing parity relationships for the identified at least one bit node or edge.

9. The device of claim 8 wherein the received information comprises one or more low density parity check (LDPC) codewords.

10. The device of claim 8 comprising a user station.

11. The device of claim 8 comprising:
   a receiver;
   a digital processing portion coupled to the receiver; and
   an antenna coupled to the receiver.

12. A communication system comprising:
   a radio frequency (RF) transceiver; and
   a decoder coupled to the RF transceiver and adapted to decode received information using a first iterative decoding process and to further decode the received information using a second decoding process different than the first iterative decoding process, wherein said second decoding process comprises:

identifying one or more check nodes having lowest metrics after a stopping criterion is reached, identifying at least once of a bit node or edge having lowest metrics and associated with each identified check node, and assessing parity relationships for the identified at least one bit node or edge.

13. The communication system of claim 12 comprising a wireless local area network (WLAN) access point (AP).

14. The communication system of claim 12 further comprising one or more antennas coupled to the RF transceiver.

15. The communication system of claim 12 comprising a cellular telephone.

16. The communication system of claim 12 comprising a personal computer.

17. The communication system of claim 12 comprising a base station.

18. A method for decoding information comprising:

receiving coded information;

iteratively decoding the received information;

after a last iteration, flipping one or more bits of the decoded information having a low probability of a certain logic state; and identifying one or more check nodes having lowest metrics.

19. The method of claim 18 further comprising:

assessing parity relationships of one or more bit nodes or edges associated with an identified check node.

20. The method of claim 19 wherein flipping one or more bits comprises changing a logic value of one or more bits associated with the assessed bit nodes or edges.

* * * * *